United States Patent [19]
Koyama

[11] Patent Number: 5,323,052
[45] Date of Patent: Jun. 21, 1994

[54] IMAGE PICKUP DEVICE WITH WIDE ANGULAR RESPONSE

[75] Inventor: Eiji Koyama, Tenri, Japan

[73] Assignee: Sharp Kabushiki Kaisha, Osaka, Japan

[21] Appl. No.: 975,916

[22] Filed: Nov. 13, 1992

[30] Foreign Application Priority Data

Nov. 15, 1991 [JP] Japan ............................ 3-300668

[51] Int. Cl.⁵ .................. H01L 27/14; H01L 31/00
[52] U.S. Cl. ................... 257/432; 257/294; 257/435; 250/208.1
[58] Field of Search .......... 257/294, 222, 291, 432, 257/435; 250/208.1, 226, 211 R, 211 J

[56] References Cited

U.S. PATENT DOCUMENTS

| | | | |
|---|---|---|---|
| 4,667,092 | 5/1987 | Ishihara | 257/432 |
| 4,694,185 | 9/1987 | Weiss | 257/432 |
| 5,118,924 | 6/1992 | Mehia et al. | 257/222 |
| 5,132,251 | 7/1992 | Kim et al. | 257/432 |
| 5,239,172 | 8/1993 | Yokota et al. | 257/431 |

FOREIGN PATENT DOCUMENTS

| | | | |
|---|---|---|---|
| 0242663 | 10/1987 | European Pat. Off. | 257/432 |
| 0441594 | 8/1991 | European Pat. Off. | 257/432 |
| 0444212 | 9/1991 | European Pat. Off. | 257/432 |
| 60-47472 | 3/1985 | Japan | 257/432 |
| 1-287952 | 11/1989 | Japan | 257/432 |
| 2-309674 | 12/1990 | Japan | 257/432 |
| 3-190167 | 8/1991 | Japan | 257/432 |
| 3-190169 | 8/1991 | Japan | 257/432 |

OTHER PUBLICATIONS

Sakakibara, K., et al., "A 1 Format 1.5M Pixel It-CCD Image Sensor for an HDTV Camera System", IEEE Transactions on Consumer Electronics, vol. 37, No. 3, Aug. 1991, pp. 487–492.

*Primary Examiner*—Rolf Hille
*Assistant Examiner*—Minhloan Tran
*Attorney, Agent, or Firm*—David G. Conlin; Henry D. Pahl, Jr.

[57] ABSTRACT

Solid image pickup apparatus, wherein a light screening film is formed with the conventional art, a polyamide resin which is a transparent resin larger in refractive index than the microlens material is applied by a spin coating method, then, it is baked for 5 through 10 minutes at 200° through 250° C. so as to form a flattened film 10a, thereafter, an acrylic resin is coated by a spin coating method.

3 Claims, 5 Drawing Sheets

Fig. 3 PRIOR ART
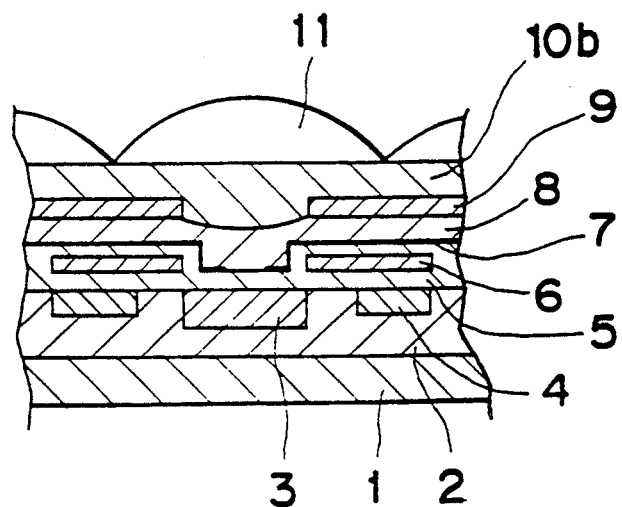
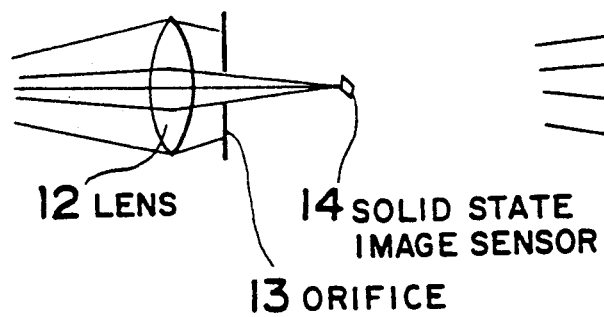
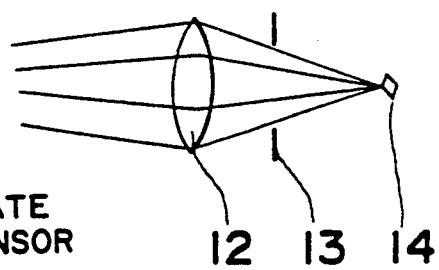

IMAGE PICKUP DEVICE WITH WIDE ANGULAR RESPONSE

BACKGROUND OF THE INVENTION

The present invention generally relates to a solid image pickup apparatus having a microlens.

A structural sectional view of the conventional solid image pickup apparatus will be described in FIG. 3. A light receiving portion 3 and a transfer portion 4 are provided on the surface portion of a P well region 2 on a N type semiconductor basic plate 1 as shown in FIG. 3. A silicon oxidizing film 5 is accumulated in these upper positions. A polysilicon electrode 6 is provided in the upper portion thereof. A silicon oxidizing film 5 is accumulated even on the polysilicon electrode 6. A tungsten silicon 7 is provided in the upper portion thereof. A BPSG film 8 is accumulated in the upper portion of the tungsten silicide 7. A light screening metal 9 is provided in the upper portion thereof so that light is not projected into the transfer portion 4. A flattening film 10b is provided on it with an acrylic resin or the like.

A microlens 11 is provided on the above described flattened film 10b with the use of a transparent resin being almost the same in refractive index as that in a flattened film material so as to improve the usage ratio of the incident light. Therefore, a substantial opening ratio is improved.

FIG. 4 shows a sectional view of an optical system mechanism such as camera and so on. In FIG. 4, reference numeral 12 is an optical system lens, reference numeral 13 is an iris, reference numeral 14 is a solid image pickup apparatus.

A solid image pickup apparatus 14 is positioned, as shown in FIG. 4, in a location where lights are gathered with the optical system lens 12 to make an image. An image is made as shown in FIG. 4 (a), (b) with the size of the opening portion of the iris 13 in this case. In the case of FIG. 4 (a), lights are collected into the light receiving portion 3 as shown in an incident light passage in FIG. 4 (a) of FIG. 5 (a). An image making position of the microlens 11 is slid sideways from the light receiving portion 3 because of obliquely incident lights, as shown in the incident light passages in FIG. 4 (b) of FIG. 5 (b), in a condition with the iris being opened as shown in FIG. 4(b). As the opening portion of the iris 13 becomes larger like this, the light collecting ratio by the microlens 11 is reduced.

SUMMARY OF THE INVENTION

Accordingly, the present invention has been developed with a view to substantially eliminating the above discussed drawbacks inherent in the prior art, and has for its essential object to provide an improved solid image pickup apparatus.

Another important object of the present invention is to provide an improved solid image pickup apparatus wherein an means for suppressing the decrease in light collecting ratio is provided with respect to the oblique incident lights.

In accomplishing these and other objects, according to one preferred embodiment of the present invention, the solid image pickup apparatus has a microphone lens provided on a flattened film, a transparent resin larger in refractive index than the microlens is used in the flattened film.

The incident lights become more orthogonal than before with respect to the light receiving face, with the use of the solid image pickup apparatus having the above described construction, as shown in the incident light passages of the solid image pickup apparatus, in FIG. 6, of the present invention.

BRIEF DESCRIPTION OF THE DRAWINGS

These and other objects and features of the present invention will become apparent from the following description taken in conjunction with the preferred embodiment thereof with reference to the accompanying drawings, in which;

FIG. 3 is a structural sectional view of the conventional solid image pickup apparatus;

FIG. 4(a) and 4(b) are the sectional views of an optical system mechanism such as camera and so on, FIGS. 5(a) and 5(b) are the incident light passage views of the conventional solid image pickup apparatus in a mechanism shown in FIG. 4;

DETAILED DESCRIPTION OF THE INVENTION

Figure 1:
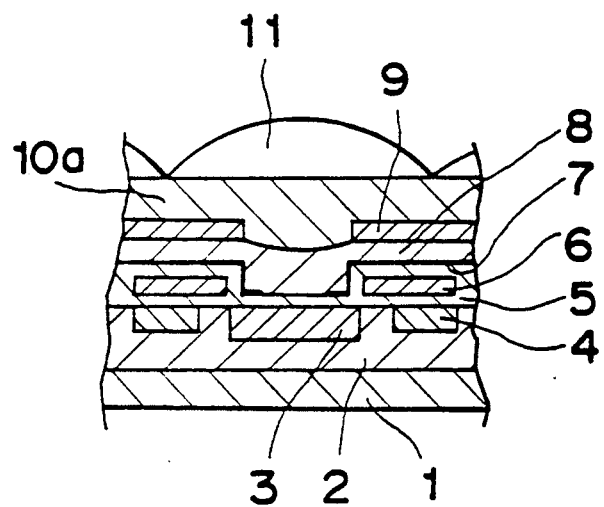
FIG. 1 is a structural sectional view in one embodiment of the present invention.

Before the description of the present invention proceeds, it is to be noted that like parts are designated by like reference numerals throughout the accompanying drawings.

The present invention will be described hereinafter in detail in accordance with one embodiment.

Figure 2A:
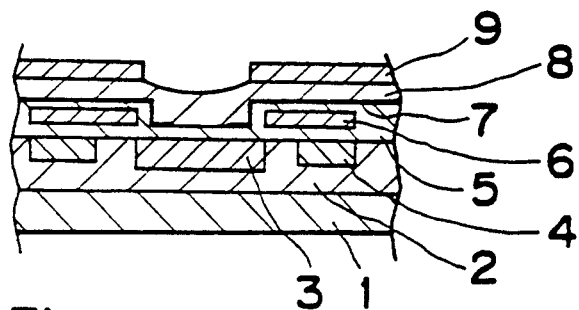
FIGS. 2(a)–2(c) are the manufacturing process views in one embodiment of the present, invention.

FIG. 1 is a structural sectional view in one embodiment of the present invention. FIG. 2 is a manufacturing process view in one embodiment of the present invention. In FIG. 1 and FIG. 2, reference numeral 1 is a N type semiconductor basic plate, reference numeral 2 is a P well layer, reference numeral 3 is a light receiving portion, reference numeral 4 is a transfer portion, reference numeral 5 is a silicon oxidizing film, reference numeral 6 is a polysilicon electrode, reference numeral 7 is a tungsten silicide, reference numeral 8 is a BPSG film, reference numeral 9 is a light screening film, reference numeral 10a shows a flattened operation where the refractive index is larger than the refractive index of a microlens material. Reference numeral 11 is a microlens.

The present invention is characterized in that a flattened film 10a is formed with a material having a refractive index larger than that of the microlens 11.

A manufacturing process will be described hereinafter with reference to FIG. 2.

By the conventional art, a P well layer 2 is formed on a N type semiconductor basic plate 1. A light receiving portion 3 and a transfer portion 4 are formed on the surface portion of the P well layer 2. Thereafter, a silicon oxidizing film 5 is accumulated, and a polysilicon electrode 6 is formed. Then, the silicon oxidizing film 5 is accumulated again as the polysilicon electrode 6 is covered. The tungsten silicide 7 is formed in the upper portion of the above described electrode 6. An aluminum silicide film is formed as a light screening film 9 after the BPSG film 8 has been accumulated. (See FIG. 2a).

Figure 2B:
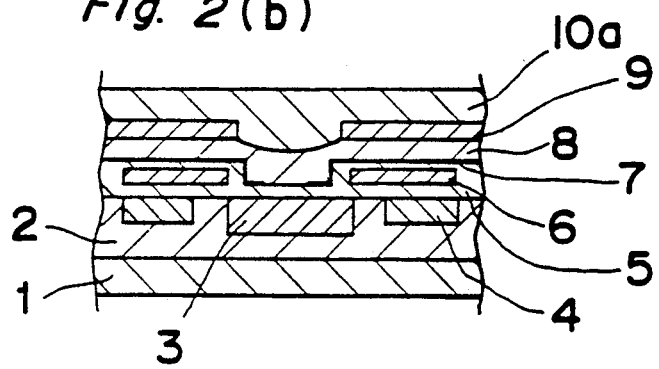

A material having a high refractive index such as a polyamide resin is applied as a flattened film material 5 with a spin coating method. It is baked for 5 through 10 minutes at 200° through 250° C. so as to form a flattened film 10a (FIG. 2b). The flattened film material has only to be larger in refractive index than the microlens material without restriction to the present invention. Also, the film thickness is different in element. In the spin coating method, the high refractive index material is painted by a coater at a certain atmosphere of temperature and humidity being constant under controlling severely the dropping amount, number and time of resolutions and others in order to obtain a predetermined thickness of the painted film. Then, it is applied to postbake aimed at drying. Since it is difficult to plateau completely the unevenness of ground as it is, it is repeated many times to do the spin coating method to improve the evenness of painted film. Normally, two times of painting can fairly be improved the evenness of painted film, and the sum of the film thickness becomes the film thickness of the evened film. In addition to the spin coating method, there is another method of etch back which is painted the material which in thickness to eliminate the effect of unevenness of the ground, and then is applied to etch by plasma the surface of material to provide the evened film.

Figure 2C:
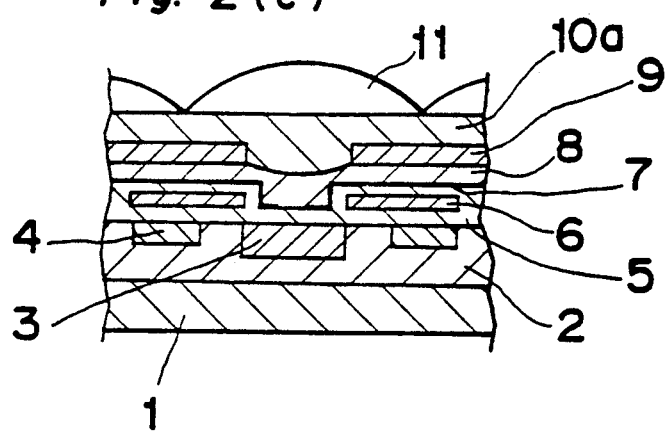
Figure 5A:
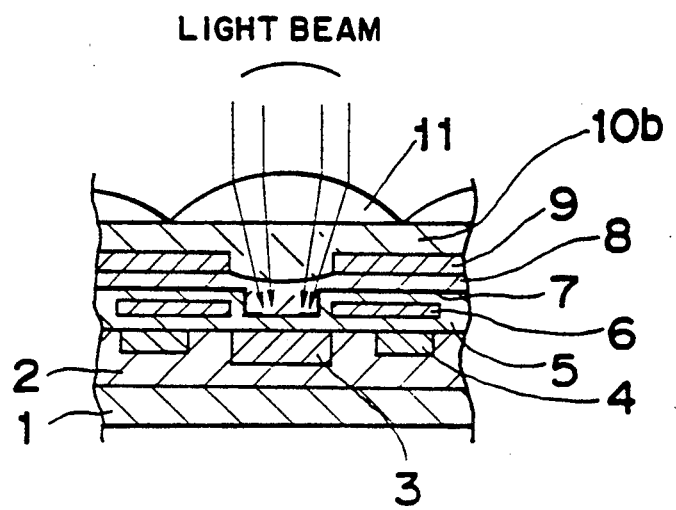
Figure 5B:
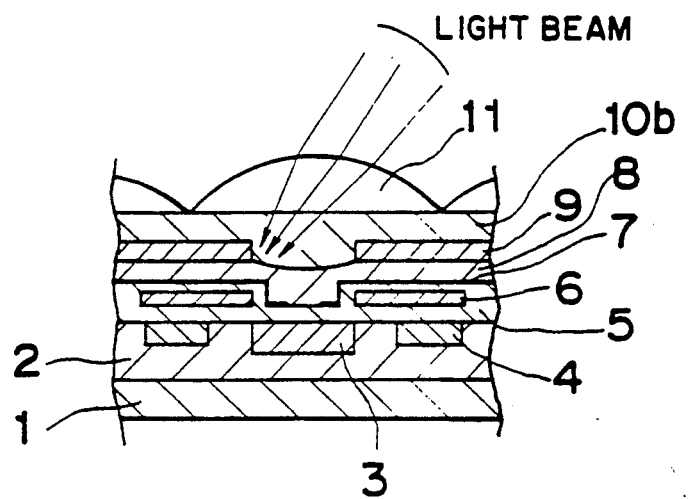
Figure 6:
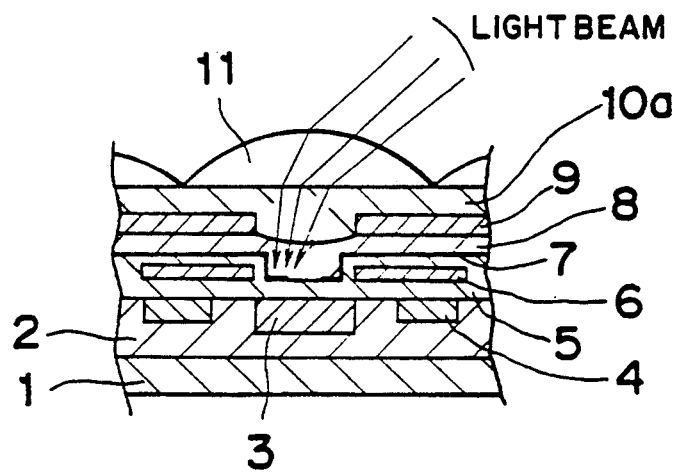
FIG. 6 is an incident light passage view of a solid image pickup apparatus of the present invention in a mechanism shown in FIG. 4.

Acrylic resin, or the like, whose refractive index is 1 or larger is coated as a lens material by a spin coating method in the same manner of coating the evened film. It is patterned by a photoetching process. At this time of applying the spin coating method, it is necessary to control severely the dropping amount, number and time of revolutions and others in order to obtain a predetermined thickness of the painted film. Thereafter, it is applied to expose and develop the painted film to do patterning. Thereafter, it is melt at 150° through 160° C. It is necessary to control severely the pattern of the painted film, and the temperature, time, humidity and others of melting so as to obtain the ideal shape of lens. Then, it is dried so as to form a microlens 11. (FIG. 2c)

With the above process, the painted film and lens material are employed to use the thermal plasticity of resin, and the other kinds of resin having thermoplasticity can also be applied to the process, for instance, acrylic resin having 1.5 of refractive index, polymidic resin having 1.8 of refractive index, novolahic resin having 2.6 of refractive index, and others.

Hereinafter, it will be explained about the range of application for the refractive index NA of the painted film and the refractive index NB of the microlens in relationship $1 < NA < X$ and $1 < NB < Y$.

The following equation will be established by optical nile in the relationship between the radius of curvature $\gamma$ and focus distance f with respect to the refractive index $N_0$ of air, the refractive indexes $N_1$ of the painted film and microlens.

$$f = \frac{N_1}{N_1 - N_0} \cdot \gamma$$

Figure 7A:
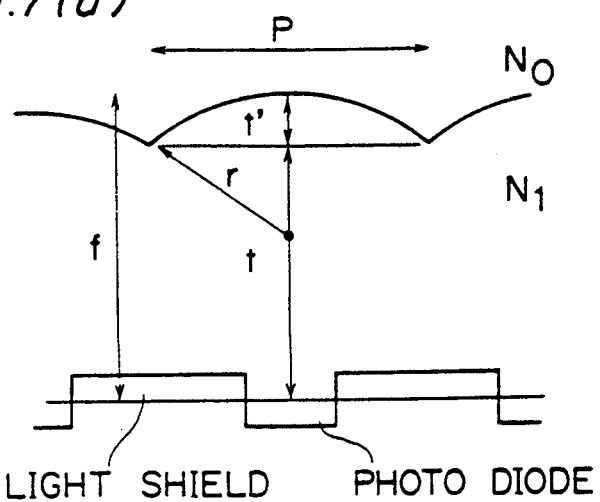
FIG. 7 (a) to (c) are graphs showing the reflected ray from a photo diode in connection with the refractive indexes of the painted film and microlens.
Figure 7B:
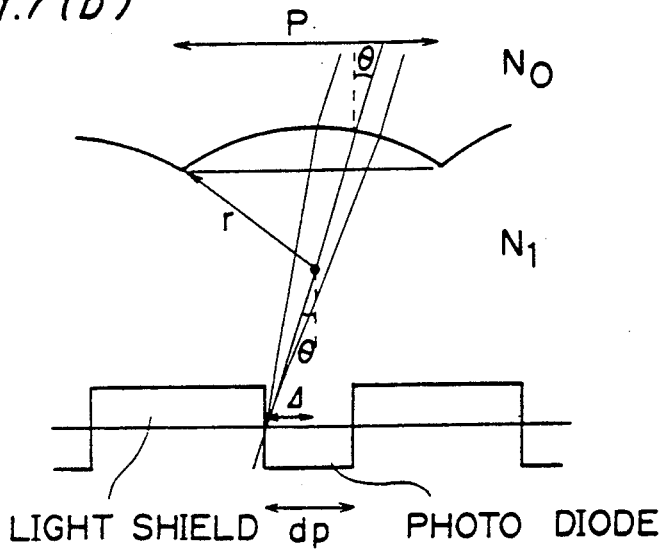
Figure 7C:
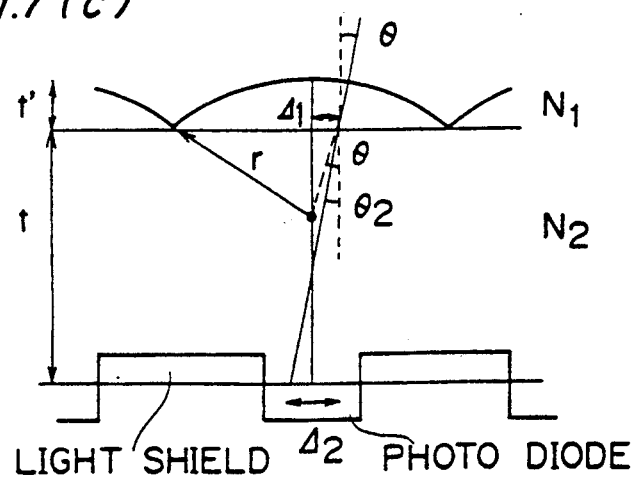

If the focus is set up in imagery on the surface of a photodiode, the following equation (1) will be established in connection with the picture element pitch P, thickness of the painted film t, and height of the microlens t', as shown in FIG. 7 (a).

$$\gamma^2 = (P/2)^2 + (\gamma - t')^2,$$

$$f = t + t'$$

then, $$t = \frac{N_1}{N_1 - N_0} \left\{ \frac{(P/2)^2 + t'^2}{2t'} \right\} - t' \quad (1)$$

with the above equation (1), when the materials of the painted film and microlens and the refractive index N are decided under the certain value of the element pitch, such as 9.6μm in the picture elements of 2.7 million in $\frac{1}{4}^N$, the lens forming is done by the values of t and t' satisfied with the equation (1) to have the imagery of focus on the surface of the photodiode. In other words, if, it is satisfied with the condition of equation (1), there is no limitation for the valve of $N_1$. However, the above assumption for the equation (1) is established in the case of incident ray being normally incident in vertical to the microlens, and, if the diaphragm of optical lens is going to open, it is incident with a certain angle into the microlens.

As shown in FIG. 7 (b), if the light beam is incident with an angle of $\theta$ with respect to the photo diode, the aberration $\Delta$ of focus will be presented by the following equation.

$$\Delta = (f - \gamma) \cdot \sin\theta = \frac{N_0}{N_1 - N_0} \cdot \gamma \cdot \sin\theta,$$

$$\text{wherein } \gamma = \frac{(P/2)^2 + t'^2}{2t'}$$

$$\text{then, } \Delta = \frac{N_0}{N_1 - N_0} \left\{ \frac{(P/2)^2 + t'^2}{2t'} \right\} \cdot \sin\theta$$

If the opening efficiency of photo diode is $\alpha$ and the opening is $\alpha P$, the following equation is established.

$$\Delta \leq \frac{\alpha P}{2}$$

When the above equation is established, the converging efficiency becomes lower even with the incident ray having the angle of $\theta$, which may be 30° in the case of wide angle lens, and may be changed to the value of 0.25 to 0.3 according to the variation of the value $\alpha$.

Consequently, when the lens is formed with the thicknesses t and t' of painted film and lens which are satisfied with the following equation (2), there is nothing of limitation for the value of $N_1$.

$$t = \frac{N_1}{N_1 - N_0} \cdot \frac{(P/2)^2 + t'^2}{2t'} - t' \quad (2)$$

$$\frac{N_0}{N_1 - N_0} \left\{ \frac{(P/2)^2 + t'^2}{2t'} \right\} \cdot \sin\theta \leq \alpha P/2$$

With the above condition of equation (2), if the painted film have the refractive index $N_2$ ($N_2 > N_1$), the aberration $\Delta'$ of focus is explained by the following equation (3).

$$\begin{aligned}
\Delta' &= -\Delta_1 + \Delta_2 \\
&= -(\gamma - r') \cdot \sin\theta + t \cdot \sin\theta_2 \\
&= -(\gamma - r') \cdot \sin\theta + t \frac{N_1}{N_2} \sin\theta
\end{aligned}$$

Therefore, $$\Delta' = \left\{ \left( \frac{N_1}{N_1 - N_0} \cdot \frac{(P/2)^2 + r'^2}{2r'} - r' \right) \frac{N_1}{N_2} - \frac{(P/2)^2 - r'^2}{2r'} \right\} \sin\theta \quad (3)$$

Accordingly, $$\Delta' \leq \alpha P/2$$

$$\begin{aligned}
\Delta' - \Delta &= 2r'\sin\theta \left\{ (P/2)^2 \frac{N_1(N_1 - N_2)}{N_2(N_1 - N_0)} + \frac{(N_1 - N_2)(2N_0 - N_1)}{(N_1 - N_0)N_2} \cdot r'^2 \right\} \\
&= 2r'\sin\theta \cdot \frac{N_1 - N_2}{N_2(N_1 - N_0)} \left\{ N_1(P/2)^2 + (2N_0 - N_1)r'^2 \right\}
\end{aligned}$$

If the condition of that $N_0 = 1$, $N_1 = 1.5$, $N_2 > N_1$ is established, the condition of $\Delta' - \Delta < 0$ is always maintained, whereby it is possible to depress the aberration of focus by any means.

As it is clear from the foregoing description, according to the arrangement of the present invention, the lateral shift in the image making position by the microlens becomes smaller than the conventional shift, as described in detail, by the use of the present invention so that the reduction in the light collecting ratio caused by the oblique incident lights can be prevented from being effected.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A solid state image pickup device comprising:
a plate-like semiconductor substrate;
formed on one face of said substrate, a photodiode for detecting incident light;
a light screening film overlying said photodiode for defining an active region thereof;
overlying said light screening film, a layer of a first transparent resin providing a flat outer surface spaced from said light screening film; and formed on said outer surface of said layer in alignment with said active region, an outwardly convex micro lens formed of a second transparent resin, the refractive index of said second resin being intermediate the refractive indices of said first resin and air.

2. A solid state image pickup device as set forth in claim 1 wherein said first resin is a polyamide.

3. A solid state image pickup device as set forth in claim 2 wherein said second resin is an acrylic.

* * * * *